US012185482B2

(12) United States Patent
Kim et al.

(10) Patent No.: US 12,185,482 B2
(45) Date of Patent: Dec. 31, 2024

(54) ARMREST TOUCH SCREEN DEVICE WITH WATER DISCHARGE FUNCTION

(71) Applicants: Hyundai Motor Company, Seoul (KR); Kia Corporation, Seoul (KR); Mobase Electronics co., ltd., Gyeonggi-do (KR)

(72) Inventors: Ji-Hwan Kim, Seoul (KR); Tae-Hoon Lee, Suwon (KR); Byeong-Seon Son, Seoul (KR); Seon-Chae Na, Yongin (KR); Sang-Ho Kim, Incheon (KR); Sang-Hoon Park, Incheon (KR); Sang-Kil Park, Gyeonggi-do (KR)

(73) Assignees: Hyundai Motor Company, Seoul (KR); Kia Corporation, Seoul (KR); Mobase Electronics co., ltd., Gyeonggi-do (KR)

( * ) Notice: Subject to any disclaimer, the term of this patent is extended or adjusted under 35 U.S.C. 154(b) by 337 days.

(21) Appl. No.: 17/885,320

(22) Filed: Aug. 10, 2022

(65) Prior Publication Data
US 2023/0171904 A1 Jun. 1, 2023

(30) Foreign Application Priority Data
Nov. 30, 2021 (KR) .................. 10-2021-0168618

(51) Int. Cl.
| | |
|---|---|
| *H05K 5/02* | (2006.01) |
| *B60K 35/00* | (2006.01) |
| *G06F 3/041* | (2006.01) |
| *H05K 7/14* | (2006.01) |
| *B60K 35/50* | (2024.01) |

(52) U.S. Cl.
CPC .......... *H05K 5/0213* (2013.01); *B60K 35/00* (2013.01); *G06F 3/041* (2013.01); *H05K 7/1427* (2013.01); *B60K 35/50* (2024.01); *B60K 2360/816* (2024.01)

(58) Field of Classification Search
CPC .... H05K 5/0213; H05K 7/1427; B60K 35/00; B60K 35/50; B60K 2360/816; G06F 3/041
See application file for complete search history.

(56) References Cited

U.S. PATENT DOCUMENTS

| | | |
|---|---|---|
| 8,963,887 B2 | 2/2015 | Son |
| 10,891,000 B2 * | 1/2021 | Le .................... A61H 7/007 |
| 2013/0100084 A1 | 4/2013 | Son |

(Continued)

FOREIGN PATENT DOCUMENTS

| | | |
|---|---|---|
| KR | 2012-0012571 A | 2/2012 |

*Primary Examiner* — Ramsey Refai
(74) *Attorney, Agent, or Firm* — Fox Rothschild LLP

(57) ABSTRACT

An armrest touch screen device with a water discharge function applied to a vehicle according to the present disclosure includes one or more of: a water discharge part defined by a touch screen panel and a screen body; a fitting coupling part defined by the touch screen panel and the screen body; a bolting fastening part defined by the touch screen panel, the screen body, a circuit board, and a screen casing; and a hook engaging part defined by the screen body and a screen casing. Accordingly, it is possible to prevent water permeation into the touch screen panel, reduce the weight and the material costs by reducing the number of screws, implement the robust touch screen design, and minimize the assembly dimension error.

14 Claims, 5 Drawing Sheets

<PART OF INTERNAL STRUCTURE AT UPPER SIDE OF TOUCH SCREEN>

(56) References Cited

U.S. PATENT DOCUMENTS

| | | | |
|---|---|---|---|
| 2015/0016000 A1* | 1/2015 | Quirk | H02H 5/083 361/78 |
| 2015/0016001 A1* | 1/2015 | Quirk | H02H 5/083 361/78 |
| 2020/0241683 A1* | 7/2020 | Le | A61H 15/0078 |

* cited by examiner

<EXPLODED VIEW OF COMPONENTS>

<SECTION A-A>

<SECTION B-B>

<PART OF INTERNAL STRUCTURE AT UPPER SIDE OF TOUCH SCREEN>

ARMREST TOUCH SCREEN DEVICE WITH WATER DISCHARGE FUNCTION

CROSS-REFERENCE TO RELATED APPLICATION

This application claims under 35 U.S.C. § 119(a) the benefit of Korean Patent Application No. 10-2021-0168618, filed on Nov. 30, 2021, which is incorporated herein by reference in its entirety.

BACKGROUND

Technical Field

The present disclosure relates to an armrest touch screen device for a vehicle, and more particularly, to an armrest touch screen device capable of resolving concern over an inflow of water to the touchscreen device by discharging the water to the outside of the touch screen device.

Background

In general, in a high-grade and other types of vehicles, a touch screen for establishing an entertainment system for an occupant seated in a rear seat may be mounted on an armrest disposed on the rear seat. Alternatively, the touch screen may be mounted on a headrest, or on the roof of the vehicle. In this case, the rear seat armrest also may be equipped with an air conditioning switch for operating a vehicle air conditioner, an audio remote control switch for operating a vehicle audio system, a heating wire switch for operating a seat heating wire, and a seat control switch for moving the rear seat forward or rearward.

For example, among the touch screen devices, an armrest touch screen device, which may be embedded in the armrest, has a touch screen exposed to an upper surface of the rear seat armrest, thereby providing convenience for the occupant by enabling the occupant to manipulate interfaces between an occupant and various vehicle entertainment systems, portable terminals, notebooks, smartphones, smart pads, and smart TV sets by inputting command signals by touching.

However, a rear-seat space in the interior of a passenger vehicle inevitably is a position at which there is a high risk that the occupant spills coffee or water held by the occupant on the rear seat armrest.

Because the armrest touch screen device may be structured to be embedded in the rear seat armrest, there is a high likelihood that water or another fluid flows into the armrest touch screen device, unlike applications in which a touchscreen is installed in a navigation position as in existing technologies. The water may flow toward electronic devices such as a printed circuit board (PCB) in the touch screen device, which may increase a likelihood of damage or malfunction of the elements in the PCB, and may even render one or more of the elements unusable.

The armrest touch screen device has a touch screen that generates heat and is subject to external pressure, and either of these factors can damage the touch screen if it is not adequately protected. For this reason, the armrest touch screen device inevitably has a structure in which the number of hardware components to be assembled is relatively high.

SUMMARY

Accordingly, the present disclosure related to an armrest touch screen device with a water discharge function, which is capable of discharging outside water, which has permeated into an internal space through a touch screen, to the outside through a water discharge path in a lateral coupled part between a touch screen and a screen body. In particular, the present disclosure relates to an armrest touch screen device with a water discharge function, in which a bolting fastening part, a fitting coupling part, and a hook engaging part, which may be disposed between a screen body and an assembling component, contribute to a decrease in overall number of components, thereby implementing robust touch screen design, minimization of assembly dimension (DIM) error, and reductions in weight and material costs.

As an exemplary embodiment, the present disclosure provides a touch screen device including: a touch screen panel connected to a circuit board and having a screen configured to receive an input; a screen body coupled to a screen casing and configured to surround the touch screen panel; and a water discharge part configured to discharge water, which is introduced from the touch screen panel, to outside of the touch screen device from a lateral side of a rim of the screen body.

In an exemplary embodiment, the water discharge part may be provided on a screen flange of the screen body that surrounds a panel rim of the touch screen panel, the screen flange may have a body sidewall and a body opening groove, the body sidewall may be spaced apart from the screen flange by a panel position section, the body opening groove may be formed as an opened outlet in the screen flange, and the opened outlet may communicate with a water inflow section defined by the panel rim and the screen flange.

In an exemplary embodiment, the body opening groove may have an inclined surface having a downward inclination angle.

The touch screen panel and the screen body may define a fitting coupling part, the fitting coupling part may be configured by a panel body protruding from an inner portion of a panel rim of the touch screen panel and a panel seating end stepped in a screen flange of the screen body, and the panel body and the panel seating end may be configured to generate a fixing force in an interference-fit manner.

In an exemplary embodiment, the touch screen panel, the screen body, the circuit board, and the screen casing may define a bolting fastening part, and the bolting fastening part may be configured to generate a fixing force by a screw.

In an exemplary embodiment, the screw may penetrate a body boss of the screen casing and a body boss of the screen body and be thread-fastened to a panel boss of the touch screen panel.

In an exemplary embodiment, the screw may penetrate a screw hole of the circuit board and be thread-fastened to a body boss of the screen body.

In an exemplary embodiment, the screen body and the screen casing may define a hook engaging part, the hook engaging part may be configured to generate a fixing force by a hook engagement structure between a body hook of the screen body and a casing hook of the screen casing, and the hook engagement structure may be a combination of a hook shape and a reverse hook shape.

In an exemplary embodiment, the touch screen panel may be mounted on an armrest positioned between rear seats of a vehicle.

The armrest touch screen device for a vehicle according to the present disclosure may implement the following operations and effects.

First, the water discharge path part, the bolting fastening part, the fitting coupling part, and the hook engaging part may be provided between the touch screen panel and the assembling component, which makes it possible to implement a touch screen having the robust design effect. Second, the water having permeated into the touch screen is discharged to the outside of the touch screen through the water discharge path of the screen body. Therefore, it is possible to prevent a breakdown of a component of an electronic device due to water even though the component is highly likely to be exposed to the inflow of water in a state in which the component is mounted on the rear seat armrest. Third, the screen body is coupled directly to the module of the touch screen panel by applying the fitting coupling part and the hook engaging part, which makes it easy to assemble the touch screen device without using a separate bracket. Fourth, the number of bolts and the number of screen casings may be reduced by applying the bolting fastening part, which reduces overall component weights and material costs. Fifth, the number of assembly processes is reduced as the bolting fastening part, the fitting coupling part, and the hook engaging part minimize the number of assembly paths for the assembling components (i.e., the touch screen panel, the screen body, and the screen casing). Therefore, it is possible to minimize DIM error, and particularly, to effectively prevent problems in the field, such as occurrence of noise due to a level difference defect or misalignment of the touch screen, which may occur in the future.

In another aspect, a vehicle is provided that comprises a touch screen device as disclosed herein.

Other aspects are disclosed infra.

DETAILED DESCRIPTION

Figure 1:
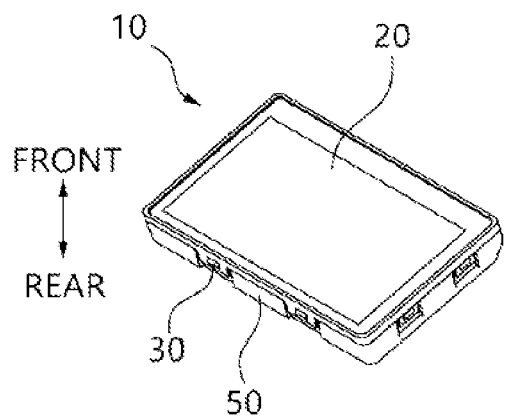
FIG. 1 is a view illustrating a touch screen device with a water discharge function according to the present disclosure.
Figure 1:
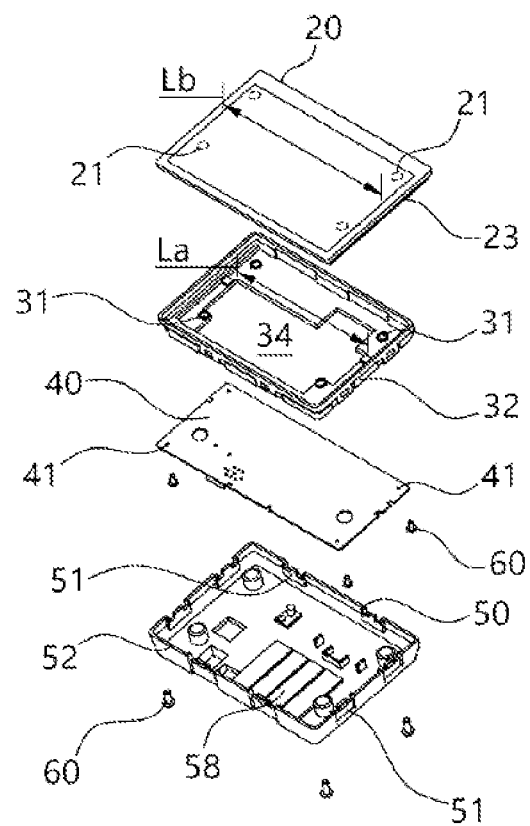

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. These terms are merely intended to distinguish one component from another component, and the terms do not limit the nature, sequence or order of the constituent components. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Although exemplary embodiments are described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium may also be distributed in network coupled computer systems so that the computer readable media is stored and executed in a distributed fashion, e.g., by a telematics server or a Controller Area Network (CAN).

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Hereinafter, some embodiments of the present disclosure will be described in detail with reference to the exemplary drawings. In the drawings, the same reference numerals will be used throughout to designate the same or equivalent elements. In addition, a detailed description of well-known features or functions will be ruled out in order not to unnecessarily obscure the gist of the present disclosure. Since the embodiments are only examples and may be implemented in various different forms by those skilled in the art to which the present disclosure pertains, the present disclosure is not limited to the embodiments described herein.

Referring to FIG. 1, a touch screen device 10 includes a touch screen panel 20, a screen body 30, a circuit board 40, a screen casing 50, and screws 60. In this case, the touch screen panel 20 may be a liquid crystal display (LCD) module in which an LCD is applied as a touch screen which is an input means.

Specifically, the touch screen panel 20 may be standardized in a rectangular shape defined by a panel rim 23. Panel bosses 21 may be formed on a panel body 25 (see FIG. 2). The panel bosses 21 protrude from the panel body 25, have a smaller size than the panel rim 23, and may be disposed on a surface of the touch screen panel 20 opposite to the touch screen. Further, the screen body 30 may be an injection-molded body standardized in a rectangular shape in which a screen flange 32 surrounds the panel rim 23 of the touch screen panel 20. Body bosses 31 may be formed on a bottom surface, which may be a space inside the screen flange 32. The body bosses 31 may be formed on the bottom surface at the periphery of a bottom space portion 34 cut out so that the circuit board 40 faces the touch screen panel 20.

For example, four panel bosses 21 and the four body bosses 31 may be disposed at positions coincident with one another, and define a fitting structure in which a protruding shape of the panel boss 21 and a groove shape of the body boss 31 may be coupled to each other. In this case, the fitting structure constitutes a bolting fastening part 10-3 (see FIG. 4).

For example, the touch screen panel 20 defines a panel outer length Lb by the panel body 25, and the screen body 30 defines a body inner length La by a body sidewall 35 (see FIGS. 2 and 3) of the screen flange 32. The panel outer length Lb may be slightly longer than the body inner length La. However, the touch screen panel 20 may be assembled with the screen body 30 by means of an interference-fit structure by using an elastic restoring force of the screen body 30. In this case, the interference-fit structure constitutes a fitting coupling part 10-2 (see FIGS. 2 and 4).

Therefore, the touch screen panel 20 and the screen body 30 may be integrated by being assembled with each other, and the screen body 30 protects the touch screen panel 20 from external impact.

The circuit board 40 may be a printed circuit board (PCB). An electric circuit line extending through the bottom space portion 34 of the screen body 30 may be electrically connected to the touch screen panel 20 and may transmit touch screen logic to the screen of the touch screen panel 20, such that an input manipulation may be performed on the screen.

The circuit board 40 may be standardized in a rectangular shape covered by the screen body 30. Four screw holes 41 may be formed at the periphery of the rim of the circuit board 40, and the screws 60 penetrate the screw holes 41. To this end, the screen body 30 divides the body bosses 31 into the body bosses 31 for the touch screen panel 20 and the body bosses 31 for the circuit board 40. The body bosses 31 for the circuit board 40 may be positioned inside the body bosses 51 for the touch screen panel 20.

For example, the screw hole 41 of the circuit board 40 may be coincident with the separate body boss 31 protruding toward the inner space of the body boss 31 from the bottom surface of the screen body 30, such that the screen body 30 and the circuit board 40 may define a coupling structure. In this case, the coupling structure constitutes the bolting fastening part 10-3 (see FIG. 4).

The screen casing 50 may be an injection-molded body standardized in a rectangular shape in which a casing flange 52 surrounds the screen flange 32 of the screen body 30. The body bosses 51 may be formed at the periphery of the screen flange 32 and protrude from the bottom surface which is the inner space of the casing flange 52.

For example, four body bosses 51 may be disposed at positions coincident with the panel bosses 21 of the touch screen panel 20 and the body bosses 31 of the screen body 30, and each have a recessed groove shape penetrated by the screw 60. The body boss 51 defines a screw embedding structure in which the screw 60 does not protrude from the screen casing 50. In this case, the screw embedding structure constitutes the bolting fastening part 10-3 (see FIG. 4).

A vent grille 58 may be formed on a bottom surface of the injection-molded body of the screen casing 50. The vent grille 58 dissipates heat, which is generated from the touch screen panel 20 and the circuit board 40, to the outside when air circulates between the internal space of the touch screen device 10 and the outside.

The screws 60 fix the touch screen panel 20, the screen body 30, the circuit board 40, and the screen casing 50.

Therefore, in a state in which the touch screen device 10 is assembled by the screws 60, the touch screen panel 20 may be assembled with the screen body 30 in a state in which the panel rim 23 and the panel body 25 may be surrounded by the screen flange 32 of the screen body 30, and the screen body 30 may be assembled with the screen casing 50 in a state in which the screen flange 32 may be surrounded by the casing flange 52 of the screen casing 50. In a state in which the circuit board 40 is positioned in the internal spaces of the screen body 30 and the screen casing 50, the circuit board 40 may be electrically connected to the touch screen panel 20, such that the touch screen logic may be input to the screen of the touch screen panel 20.

Figure 2:
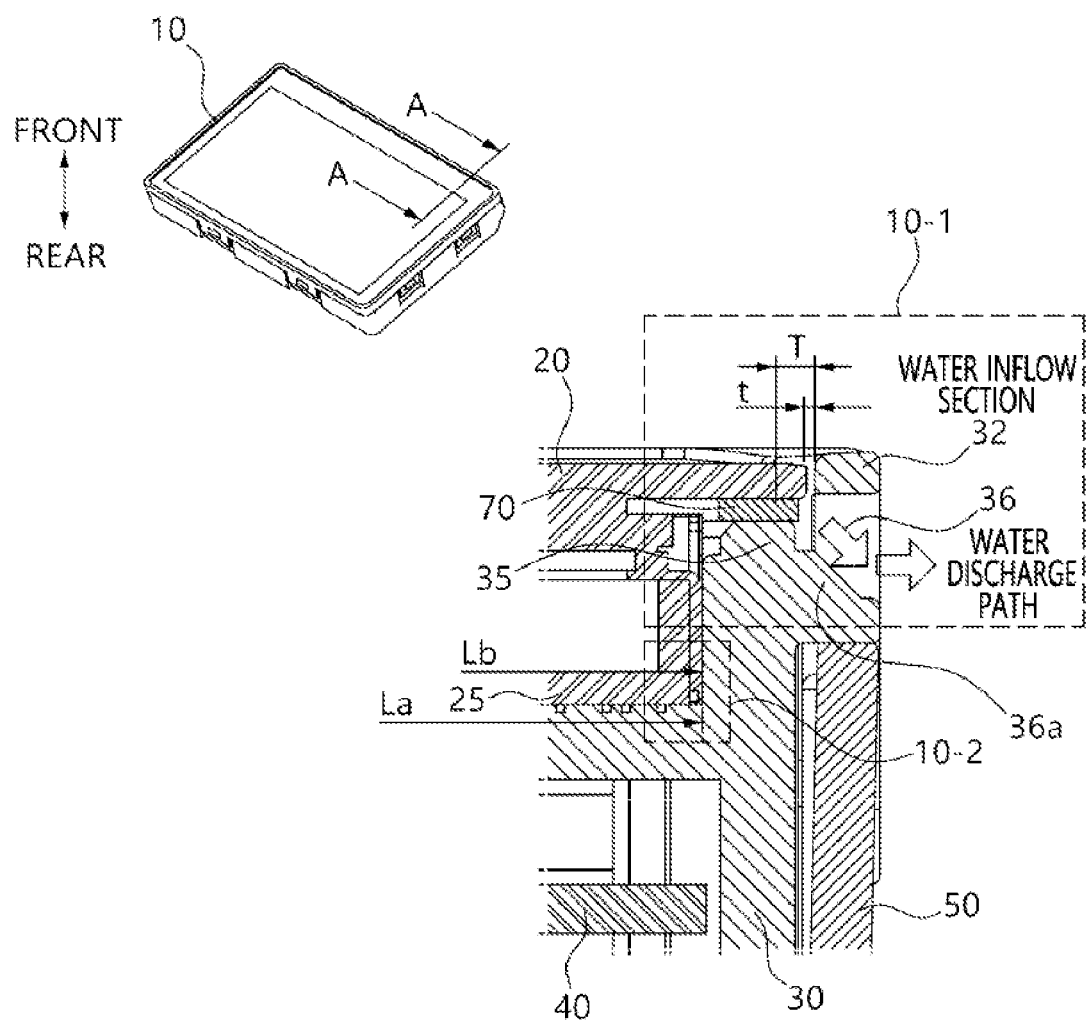
FIG. 2 a view illustrating a water discharge part and a fitting coupling part of the touch screen device with a water discharge function according to the present disclosure.
Figure 3:
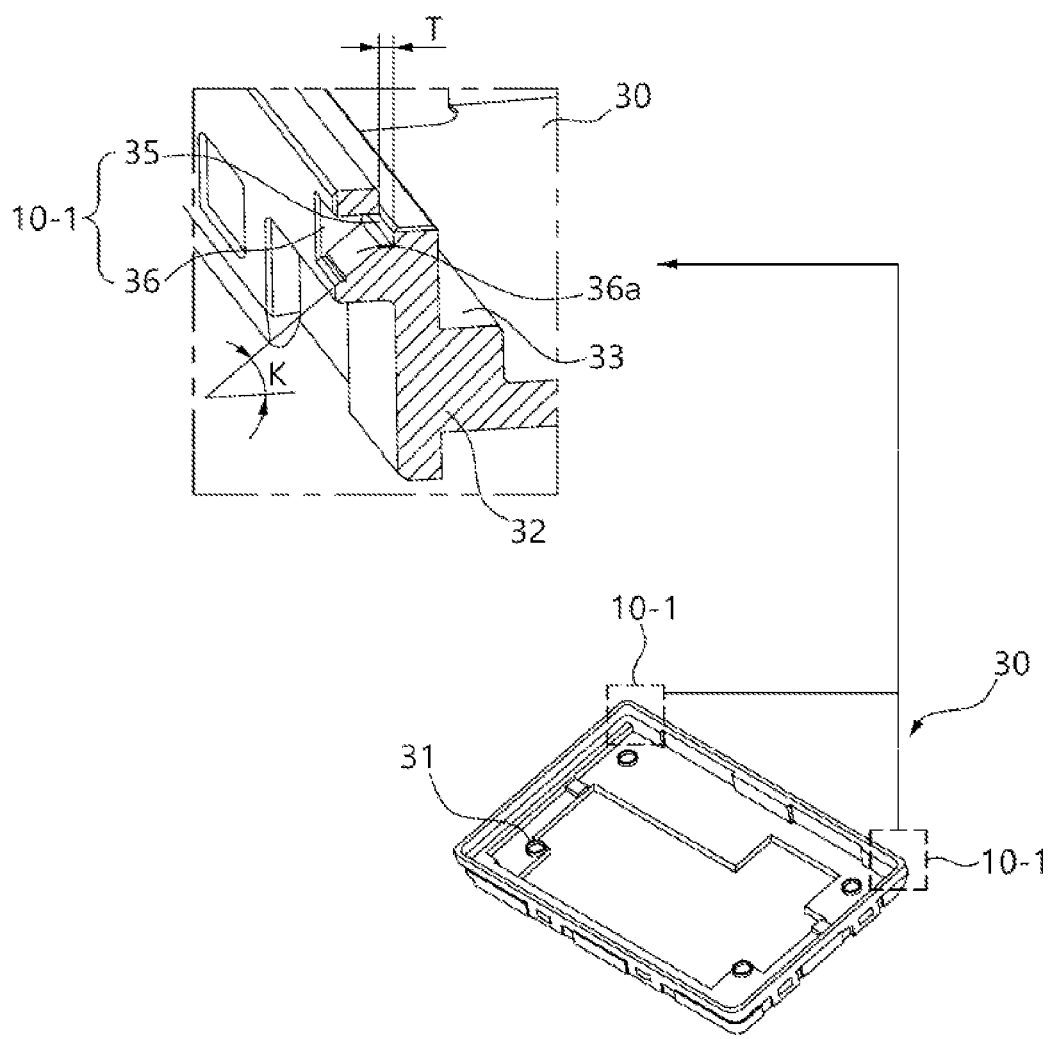
FIG. 3 is a view illustrating a shape of a screen body that constitutes the water discharge part according to the present disclosure.
Figure 4:
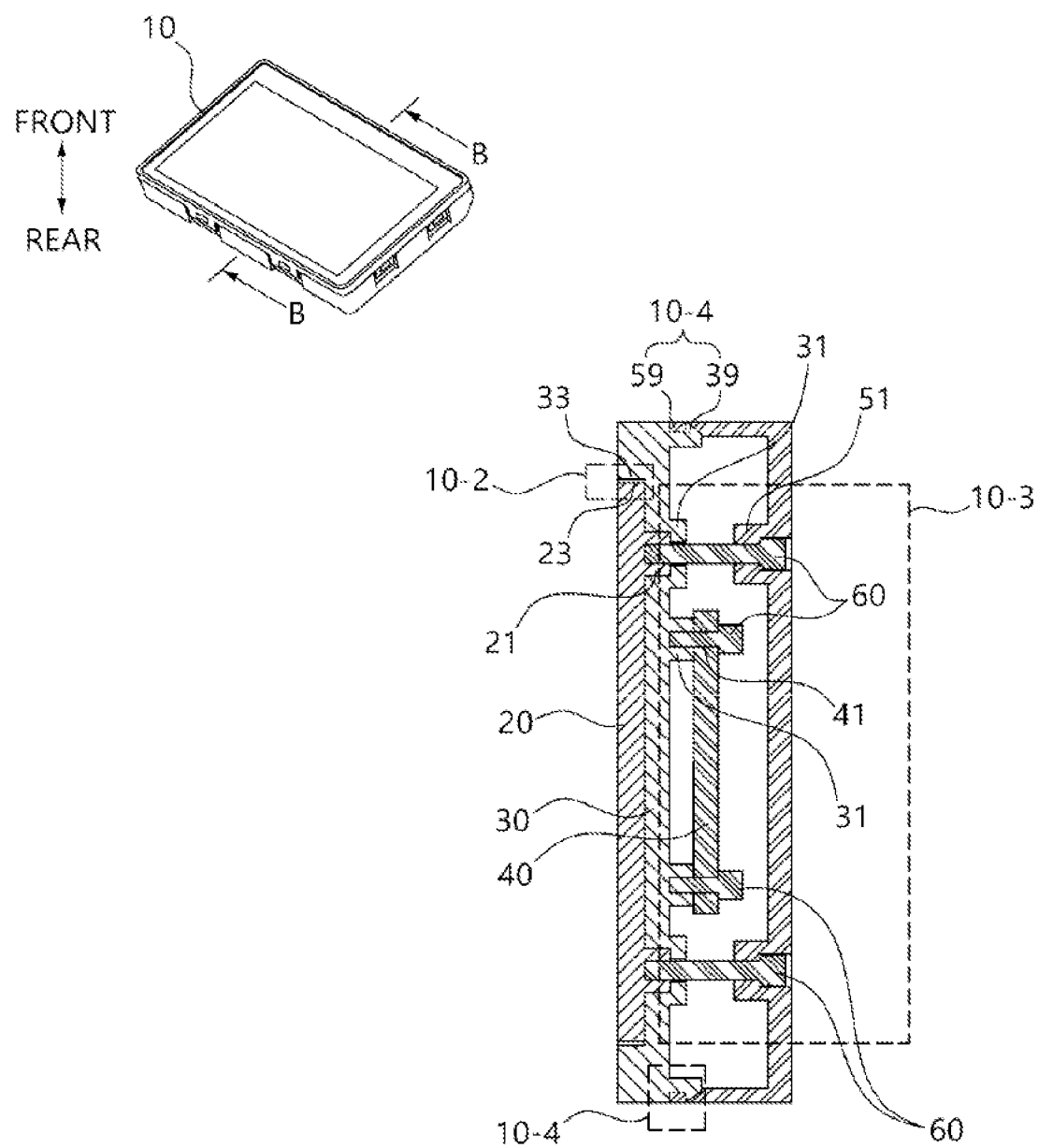
FIG. 4 is a view illustrating a bolting fastening part and a hook engaging part of the touch screen device with a water discharge function according to the present disclosure.

Meanwhile, FIGS. 2 to 4 illustrate configurations of a water discharge part 10-1, the fitting coupling part 10-2, the bolting fastening part 10-3, and a hook engaging part 10-4 applied to the touch screen device 10.

Referring to FIG. 2, the screen body 30 defines a panel position section "T" between the screen flange 32 and the body sidewall 35, and the panel rim 23 of the touch screen panel 20 may be positioned in the panel position section T. The touch screen panel 20 and the screen body 30 define a water inflow section "t" into which water flows in the assembled state.

Therefore, the water discharge part 10-1 may be configured by the body sidewall 35 and a body opening groove 36 at the screen flange 32 of the screen body 30. The body sidewall 35 and the body opening groove 36 define an opened outlet that allows the water inflow section t to communicate with the other side, such that the water introduced into the water inflow section t may be discharged to the outside while flowing along the body sidewall 35 and the body opening groove 36. In this case, contact surfaces between the body sidewall 35 and the panel rim 23 of the touch screen panel 20 may be sealed by a double-sided tape 70, and the double-sided tape 70 blocks the internal space from the outside.

In addition, the body sidewall 35 of the screen body 30 presses the panel body 25 of the touch screen panel 20 by means of a difference (Lb>La) between the panel outer length Lb and the inner length La. This assembled structure constitutes the fitting coupling part 10-2 that strongly fixes, by using an elastic force, the panel body 25 of the touch screen panel 20 fitted with the screen body 30.

Referring to FIG. 3, the screen flange 32 defines a panel seating end 33, the body sidewall 35, and the body opening groove 36. In this case, the water discharge part 10-1 may be defined by using an edge portion of the screen flange 32, for example. However, as necessary, a plurality of water discharge parts 10-1 may be provided at predetermined intervals.

For example, the panel seating end 33 defines a stepped structure together with the body sidewall 35 and may be positioned inside the screen flange 32 of the screen body 30, such that the fitting coupling part 10-2 may be defined as the panel body 25 of the touch screen panel 20 when seated.

For example, the body sidewall 35 may be spaced apart from the screen flange 32 by the panel position section T, and the body opening groove 36 defines the opened outlet in the screen flange 32 to expose the body sidewall 35 to the outside, such that the water discharge part 10-1 may be formed.

The body opening groove 36 may have an inclined surface 36a with a downward inclination angle K which may be an acute angle. The inclined surface 36a serves to allow the water to quickly flow along the body opening groove 36 by gravity.

Referring to FIG. 4, the bolting fastening part 10-3 may be defined by fastening the touch screen panel 20, the screen body 30, and the screen casing 50 by means of the screws 60 and fastening the screen body 30 and the circuit board 40 by means of others of the screws 60. The hook engaging part 10-4 may be defined by the screen body 30 and the screen casing 50.

Specifically, the bolting fastening part 10-3 may be divided into an outer bolting fastening part for fixing the touch screen panel 20, the screen body 30, and the screen casing 50 by means of the screws 60, and an inner bolting fastening part for fixing the screen body 30 and the circuit board 40 by means of others of the screw 60.

For example, the touch screen panel 20, the screen body 30, and the screen casing 50 may be assembled as the outer bolting fastening part of the bolting fastening part 10-3 and may be thread-fastened as the screws 60 penetrate the body bosses 51 of the screen casing 50 and the body bosses 31 of the screen body 30 and the panel bosses 21 of the touch screen panel 20.

In contrast, the screen body 30 and the circuit board 40 may be assembled as the inner bolting fastening part of the bolting fastening part 10-3 and may be thread-fastened as the screws 60 penetrate the screw holes 41 of the circuit board 40 and the body bosses 31 of the screen body 30.

Therefore, the bolting fastening part 10-3 uses the eight screws 60. Four of the screws 60 may be used for the outer bolting fastening part to fix the touch screen panel 20, the screen body 30, and the screen casing 50. The remaining four screws 60 may be used for the inner bolting fastening part to fix the screen body 30 and the circuit board 40.

The hook engaging part 10-4 may be defined by the screen body 30 and the screen casing 50, and fixes the screen body 30 and the screen casing 50 by means of a coupling structure between a body hook 39 and a casing hook 59. In this case, the hook engaging part 10-4 is continuously defined along the screen flange 32 of the screen body 30 and the casing flange 52 of the screen casing 50. However, as necessary, the hook engaging part 10-4 may be defined only at the edge portion.

For example, the body hook 39 has a hook shape and may be disposed on the screen flange 32 of the screen body 30, and the casing hook 59 has a reverse hook shape and may be disposed on the casing flange 52 of the screen casing 50.

Therefore, as the hook shape of the body hook 39 and the reverse hook shape of the casing hook 59 engage with each other, the hook engaging part 10-4 provides a fixing force in the state in which the screen flange 32 of the screen body 30 is surrounded by the casing flange 52 of the screen casing 50.

Figure 5:
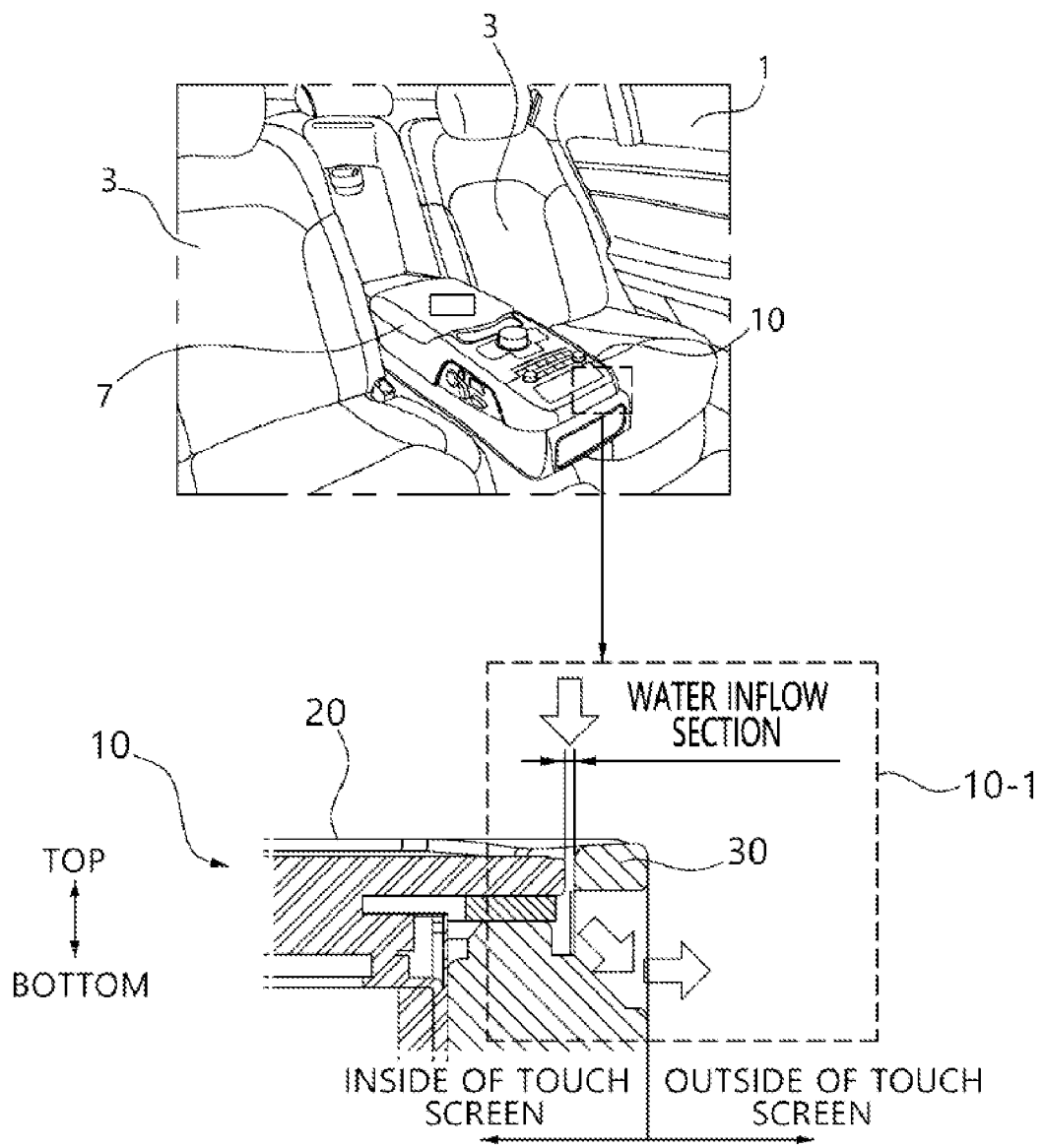
FIG. 5 is a view illustrating an example in which the touch screen device with a water discharge function according to the present disclosure is applied to an armrest of a vehicle.

Meanwhile, referring to FIG. 5, the touch screen device 10 may be mounted on an armrest 7 positioned between a vehicle 1 and a rear seat 3.

In particular, in the touch screen device 10, the water discharge part 10-1 defined in the left/right portion of the screen body 30 mounted on the touch screen panel 20 may prevent an inflow of water from a portion of the armrest 7 positioned on the rear seat 3 that is highly likely to be exposed to the inflow of water. Therefore, it is possible to reduce the total number of components by using the fitting coupling part 10-2, the bolting fastening part 10-3, and the hook engaging part 10-4 (see FIGS. 2 and 4).

Therefore, the touch screen device 10 may be characterized as an armrest touch screen device with a water discharge function to which the water discharge part 10-1 is applied. Also, the touch screen device 10 may prevent an increase in the number of hardware components used to assemble the armrest 7, without resulting in damage to the touch screen panel 20 due to heat generation and the application of external pressure to the LCD of the touch screen panel 20. Accordingly, it is possible to prevent the use of an excessive number of hardware components, which causes increases in weight, and material costs.

As described above, according to the exemplary embodiment of the armrest touch screen device 10 with a water discharge function applied to the vehicle 1, the screen body 30 configured to surround the touch screen panel 20 connected to the circuit board 40 may be coupled to the screen casing 50, and the armrest touch screen device 10 includes one or more of: the water discharge part 10-1 defined by the touch screen panel 20 and the screen body 30 to discharge the introduced water to the outside; the fitting coupling part 10-2 configured to generate the fixing force for the touch screen panel 20 and the screen body 30; the bolting fastening part 10-3 configured to thread-fasten the touch screen panel 20, the screen body 30, the circuit board 40, and the screen casing 50 by means of the screws 60; and the hook engaging part 10-4 configured to generate the fixing force for the screen body 30 and the screen casing 50. Accordingly, it is possible to prevent water permeation into the touch screen panel 20, reduce the weight and the material costs by reducing the number of screws 60, implement the robust touch screen design, and minimize the assembly dimension error.

What is claimed is:

1. A touch screen device comprising:
   a touch screen panel connected to a circuit board and comprising a screen configured to receive an input;
   a screen body coupled to a screen casing and configured to surround the touch screen panel; and
   a water discharge part configured to discharge water, which is introduced to the water discharge part from the touch screen panel, to outside of the touch screen device from a lateral side of a rim of the screen body.

2. The touch screen device of claim 1, wherein the water discharge part is provided on a screen flange of the screen body that surrounds a panel rim of the touch screen panel.

3. The touch screen device of claim 2, wherein the screen flange has a body sidewall and a body opening groove, the body sidewall is spaced apart from the screen flange by a panel position section, and the body opening groove is formed as an opened outlet in the screen flange.

4. The touch screen device of claim 3, wherein the body opening groove has an inclined surface having a downward inclination angle.

5. The touch screen device of claim 3, wherein the opened outlet communicates with a water inflow section defined by the panel rim and the screen flange.

6. The touch screen device of claim 1, wherein the touch screen panel and the screen body define a fitting coupling part, and the fitting coupling part comprises a panel body protruding from an inner portion of a panel rim of the touch screen panel and a panel seating end stepped in a screen flange of the screen body.

7. The touch screen device of claim 6, wherein the panel body and the panel seating end are configured to generate a fixing force in an interference-fit manner.

8. The touch screen device of claim 1, wherein the touch screen panel, the screen body, the circuit board, and the screen casing define a bolting fastening part, and the bolting fastening part is configured to generate a fixing force by a screw.

9. The touch screen device of claim 8, wherein the screw is configured to penetrate a body boss of the screen casing and a body boss of the screen body and is thread-fastened to a panel boss of the touch screen panel.

10. The touch screen device of claim 8, wherein the screw is configured to penetrate a screw hole of the circuit board and is thread-fastened to a body boss of the screen body.

11. The touch screen device of claim 1, wherein the screen body and the screen casing define a hook engaging part, and the hook engaging part is configured to generate a fixing force by a hook engagement structure between a body hook of the screen body and a casing hook of the screen casing.

12. The touch screen device of claim 11, wherein the hook engagement structure is a combination of a hook shape and a reverse hook shape.

13. The touch screen device of claim 1, wherein the touch screen panel is configured to be mounted on an armrest positioned between rear seats of a vehicle.

14. A vehicle comprising a touch screen device of claim 1.

* * * * *